(12) United States Patent
Liaw

(10) Patent No.: US 9,646,974 B1
(45) Date of Patent: May 9, 2017

(54) DUAL-PORT STATIC RANDOM ACCESS MEMORY

(71) Applicant: TAIWAN SEMICONDUCTOR MANUFACTURING CO., LTD., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/214,790

(22) Filed: Jul. 20, 2016

Related U.S. Application Data

(60) Provisional application No. 62/313,676, filed on Mar. 25, 2016.

(51) Int. Cl.
  *H01L 27/11* (2006.01)
  *G11C 11/412* (2006.01)

(52) U.S. Cl.
  CPC ........ *H01L 27/1104* (2013.01); *G11C 11/412* (2013.01)

(58) Field of Classification Search
  CPC ...... H01L 27/1104; H01L 27/11; H01L 27/10; H01L 27/105; G11C 11/412; G11C 11/41; G11C 11/40; G11C 11/34; G11C 11/21
  See application file for complete search history.

(56) References Cited

U.S. PATENT DOCUMENTS

| | | | | |
|---|---|---|---|---|
| 6,778,462 B1 * | 8/2004 | Castagnetti | ............. | G11C 8/14 365/230.05 |
| 8,009,463 B2 * | 8/2011 | Liaw | ....................... | G11C 8/16 365/154 |
| 8,315,084 B2 * | 11/2012 | Liaw | ..................... | G11C 11/412 365/154 |
| 8,675,397 B2 * | 3/2014 | Liaw | ....................... | G11C 8/16 365/154 |
| 9,099,172 B2 * | 8/2015 | Liaw | ....................... | G11C 8/16 |
| 9,418,728 B2 * | 8/2016 | Liaw | ..................... | G11C 11/412 |
| 2015/0170735 A1 * | 6/2015 | Paul | ..................... | G11C 11/412 365/154 |
| 2016/0190141 A1 * | 6/2016 | Lee | ..................... | H01L 27/1104 257/390 |
| 2016/0293247 A1 * | 10/2016 | Vijayan | ..................... | G11C 8/16 |

* cited by examiner

*Primary Examiner* — Scott B Geyer
(74) *Attorney, Agent, or Firm* — McDermott Will & Emery LLP

(57) ABSTRACT

A dual-port static random access memory (SRAM) cell includes first through third power lines, a storage unit connected to the first through third power lines, a first port having first and second pass-gate transistors controlled by a first wordline, a second port having third and fourth pass-gate transistors controlled by a second wordline, and first through fourth bitlines coupled to the storage unit through the first through fourth pass-gate transistors, respectively. The first through fourth bitlines and the first through third power lines each extend in a first direction and are formed of a first metal layer. The first wordline extends in a second direction substantially perpendicular to the first direction and is formed of a second metal layer above the first metal layer. The second wordline extends in the second direction and is formed of a upper-level metal layer above the second metal layer.

20 Claims, 12 Drawing Sheets

FIG. 4

DUAL-PORT STATIC RANDOM ACCESS MEMORY

CROSS REFERENCE TO RELATED APPLICATION

This application claims priority to U.S. Provisional Application No. 62/313,676 filed Mar. 25, 2016, entitled "DUAL-PORT STATIC RANDOM ACCESS MEMORY," the entire disclosure of which is incorporated herein by reference.

TECHNICAL FIELD

The present disclosure is generally related to a static random access memory (SRAM), and more particularly, to an SRAM having lithography friendly patterns.

BACKGROUND

Static random access memory (SRAM) is commonly used for data storage when the SRAM is supplied with power. To meet the demand in portable electronics and high speed computation, it is desirable to integrate more data storage cells including cross-coupled invertors into a single SRAM chip and to lower power consumption thereof, for example, by replacing conventional transistors with fin field-effect transistors (FinFET) having smaller size and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 shows a first portion of a layout of a memory cell according to embodiments of the present disclosure.

DETAILED DESCRIPTION

Figure 1:
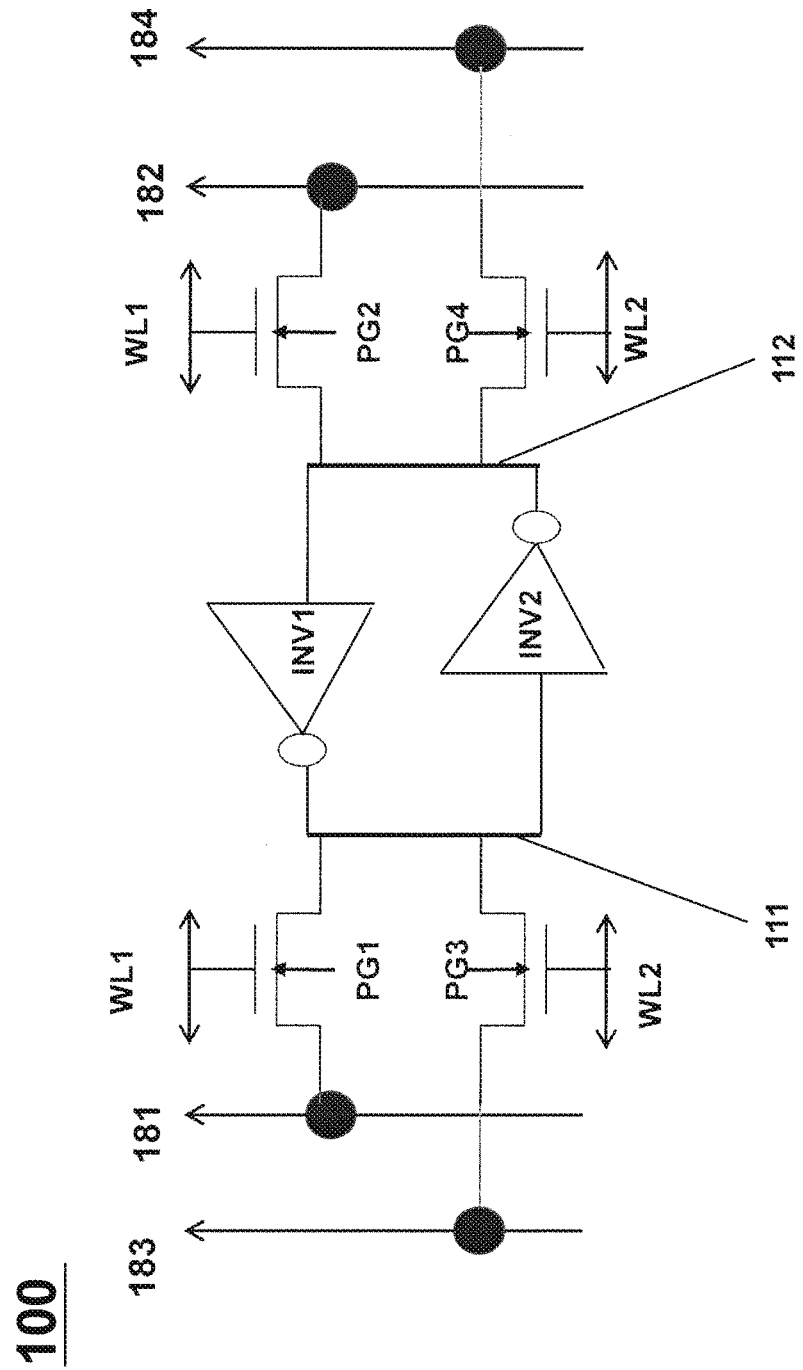
FIGS. 1 and 2 each illustrate a circuit diagram of a dual-port static random access memory (SRAM) cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a layer, a pattern, a line such as a bitline, a wordline, and a power line, or a structure extending in one direction means that a dimension of the layer, the pattern, the line, or the structure in the extended one direction is greater than another dimension thereof in another direction perpendicular to the extended one direction, with consideration of process errors occurred during manufacturing. In the present disclosure, unless described explicitly, extending a layer, a pattern, a line, or a structure means unidirectionally extending a layer, a pattern, a line (including a bitline or a wordline), with consideration of process errors in manufacturing. That is, unless described explicitly, extending a layer, a pattern, a line, or a structure means forming a layer, a pattern, a line, or a structure having the same width with consideration of process errors. It should be understood that in the present disclosure, one pattern (or one direction) being perpendicular or substantially perpendicular to another pattern (or another direction) means that the two patterns (or two directions) are perpendicular to each other or the two patterns (or two directions) are perpendicular to each other with consideration of margins or errors in manufacturing process. It should be understood that in the present disclosure, one pattern (or one direction) being parallel or substantially parallel to another pattern (or another direction) means that the two patterns (or two directions) are parallel to each other or the two patterns (or two directions) are parallel to each other with consideration of margins or errors in manufacturing process.

It should be appreciated that vias in the present disclosure, represented by circular shaped patterns in the accompanying drawings, can have a rectangular or square shape.

FIG. 1 illustrates a circuit diagram of a dual-port static random access memory (SRAM) cell 100. The SRAM cell 100 includes cross-coupled first and second inverters INV1 and INV2, and first through fourth pass-gate transistors PG1 through PG4. Source electrodes of the first and second pass-gate transistors PG1 and PG2 are respectively coupled to a first bitline 181 and a second bitline 182 which is a complementary bitline of the first bitline 181, and gate electrodes thereof are both coupled to a first wordline WL1. Source electrodes of the third and fourth pass-gate transistors PG3 and PG4 are respectively coupled to a third bitline 183 and a fourth bitline 184 which is a complementary bitline of the third bitline 183, and gate electrodes thereof are both coupled to a second wordline WL2. Drain electrodes of the first and third pass-gate transistors PG1 and PG3, an output of the first invertor INV1, and an input of the second invertor INV2 are coupled to each other by a first local connection electrode 111. Drain electrodes of the second and fourth pass-gate transistors PG2 and PG4, an input of the first invertor INV1, and an output of the second invertor INV2 are coupled to each other by a second local connection electrode 112. The cross-coupled first and second inverters INV1 and INV2 function as a latch that stores a value and its complement. The first and second pass-gate transistors PG1 and PG2 form a first port while the third and fourth pass-gate transistors PG3 and PG4 form a second port of the dual-port SRAM cell 100.

Figure 2:
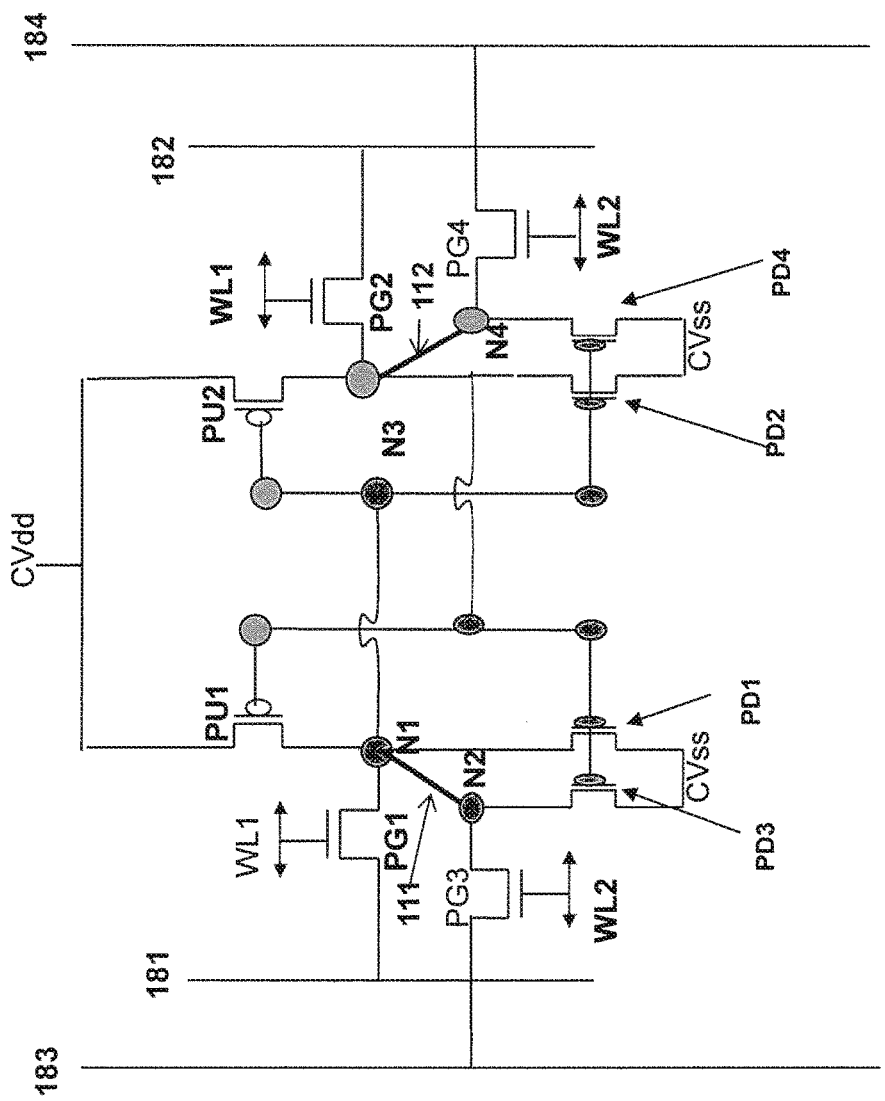

FIG. 2 illustrates a more detailed circuit diagram of the dual-port SRAM cell 100. In FIG. 2, the cross-coupled invertors INV1 and INV2 of FIG. 1 are implemented by a first pull-up transistor PU1 and parallel first and third pull-down transistors PD1 and PD3, and by a second pull-up transistor and parallel second and fourth pull-down transistors PD2 and PU4, respectively. Drain electrodes of the first pull-up transistor PU1, the first pass-gate transistor PG1, and the first pull-down transistor PD1 are connected to each other at a node N1, and drain electrodes of the third pass-gate transistor PG3 and the third pull-down transistor PD3 are connected to each other at a node N2. The nodes N1 and N2 are connected to each other by the first local connection electrode 111. Drain electrodes of the second pull-up transistor PU2, the second pass-gate transistor PG2, and the second pull-down transistor PD2 are connected to each other at a node N3, and drain electrodes of the fourth pass-gate transistor PG4 and the fourth pull-down transistor PD4 are connected to each other at a node N4. The nodes N3 and N4 are connected to each other by the second local connection electrode 112.

Source electrodes of the first and third pull-down transistors PD1 and PD3 are connected one power supply CVss and Source electrodes of the second and fourth pull-down transistors PD2 and PD4 are connected to another power line CVss. The one and the other one power supply CVss can be directly connected to each other in the region of the memory cell 100 according to some embodiments, or can be electrically isolated to each other in the region of the memory cell 100 but connected to each other in a region outside the memory cell 100 according to other embodiments. These features will be described with reference to FIGS. 4 through 7.

Source electrodes of the first and second pull-up transistors PU1 and PU2 are connected to another power line CVdd.

A description of other features overlapping those described above with reference to FIG. 1 will be omitted in order to avoid redundancy.

Figure 3:
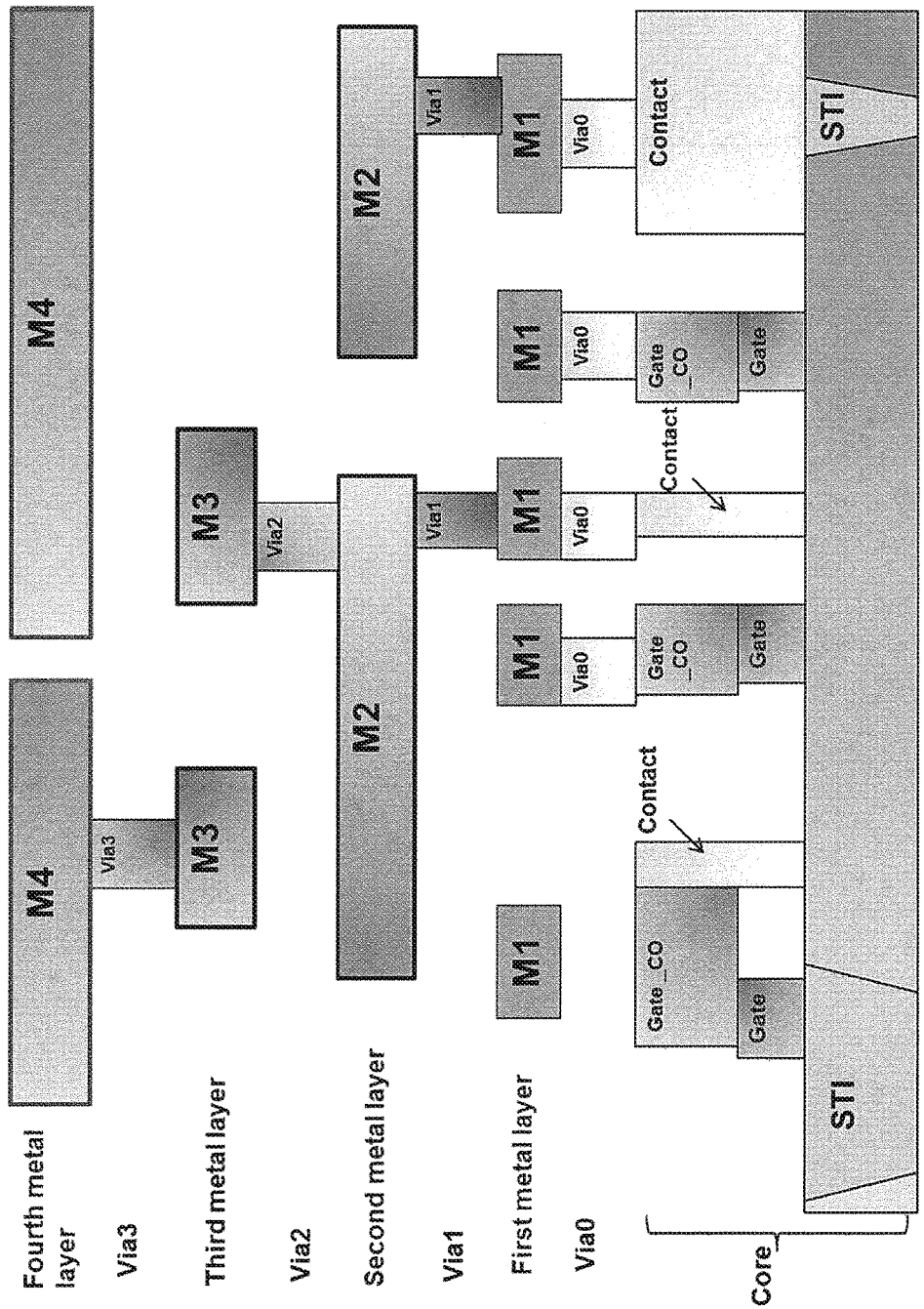
FIG. 3 is an exemplary cross-sectional view schematically illustrating a vertical arrangement of layers of a semiconductor device according to embodiments of the present disclosure.

FIG. 3 is an exemplary cross-sectional view schematically illustrating a vertical arrangement of layers of a semiconductor device according to embodiments of the present disclosure. Such a vertical arrangement can be implemented to manufacture a memory device including an array of the aforementioned dual-port SRAM cells. The routing of the various layers of the aforementioned dual-port SRAM cell will be described later with reference to FIGS. 4 through 5D and FIGS. 7A and 7B.

Referring to FIG. 3, the vertical arrangement of layers of a semiconductor device in a laminated direction can include a core layer, first through fourth metal layers over the core layer, and Via0 through Via3 interposed among the core layer and the first through fourth metal layers. The core layer may include semiconductor regions (not shown) including channel regions (not shown) and heavily doped regions (not shown) forming source and drain regions of transistors, gate layers (for example, the components labeled as "gate") covering the channel regions, source and drain electrodes and local interconnection layers (for example, the components labeled as "contact") formed over the source and drain regions, and gate contacts (for example, the components labeled as "Gate-CO") electrically connecting the gate layer to Via0 or to the local interconnection layers. It should be appreciated that different types of semiconductor wells can be defined by shallow trench isolation (STI) such that different types of transistors can be formed in corresponding semiconductor wells.

Metal layers including the first through fourth metal layers can be formed at various levels above the core level. The metal layers at different levels can be electrically connected to each other by vias including Via0 through Via3 disposed therebetween. Thus, in a memory device, through the metal layers and vias, data can be read from and written to the memory device so as to exchange data between the memory device and an external device or a bus, internal data can be transmitted within the memory device or memory cells, and read/write control signals can be applied to the memory device or corresponding memory cells.

It should be appreciated that in FIG. 3, four metal layers and three via levels therebetween are illustrated as an example, but the present disclosure is not limited thereto. According to other embodiments, the memory device may have fewer metal layers with fewer vias therebetween or have more metal layers with more vias therebetween. For example, the memory cell of which a portion of the layout is depicted in FIG. 5B only has three metal layer above the core layer and two vias therebetween. The vias and metal layers are made of, but not limited to, one or more layers of Cu, W, Al, AlCu, TiN, TiW, Ti, Co, Ni, TaN, Ta, or combination thereof.

Figure 4:
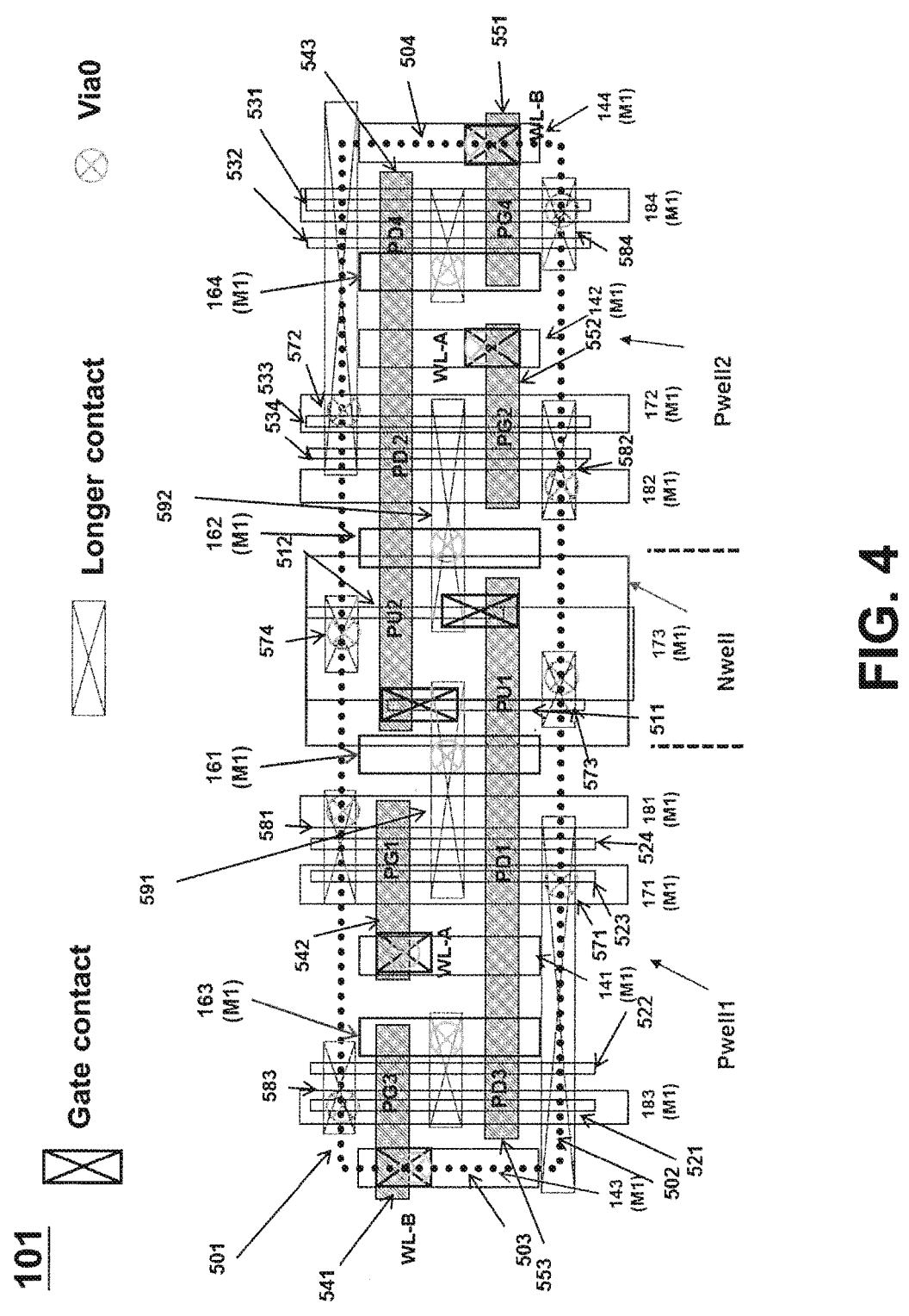

FIG. 4 shows a first portion of a layout of a memory cell according to embodiments of the present disclosure. For convenience of description, FIG. 4 shows various layers in the core level, the first metal layer M1, and the Via0 between the core level and the first metal layer M1. Other layers of the memory cell according to embodiments of the present disclosure at the level above the core level are depicted in FIGS. 5A through 5D to be described later.

As shown in FIG. 4, the first portion 101 of the layout of the memory cell according to embodiments of the present disclosure is defined by boundaries 501 through 504. The boundaries 501 through 504 form a rectangular shape, although the present disclosure is not limited thereto. The boundaries 501 and 502 are parallel to each other and are connected to each other by the other two parallel boundaries 503 and 504. It should be appreciated that a respective layer of a memory cell that touches or crosses a boundary thereof is continuously formed when another memory cell is disposed immediately adjacent to the memory cell along the common boundary thereof. In other words, the respective layer of the memory cell and another layer of the adjacent memory cell corresponding to the respective layer form a single continuous layer.

Referring to FIG. 4, the memory cell includes an N-type well Nwell and first and second P-type wells Pwell1 and Pwell2 disposed at opposite sides of the N-type well Nwell. Semiconductor fins 511 and 512 each acting as an active region are formed in the N-type well Nwell, semiconductor fins 521 through 524 are arranged in the first P-type well Pwell1, and semiconductor fins 531 through 534 are arranged in the second P-type well Pwell2.

Gate layers 541 through 543 are spaced-apart from each other and extend along a line parallel to the boundary 501 or 502. The gate layer 541 extends over the semiconductor fins 521 and 522, the gate layer 542 extends over the semiconductor fins 523 and 524, and the gate layer 543 extends over the semiconductor fins 512, 534, 533, 532, and 531. Similar to the gate layers 541 through 543, gate layers 551 through 553 are spaced-apart from each other and extend along a line parallel to the boundary 501 or 502. The gate layer 551 extends over the semiconductor fins 531 and 532, the gate layer 552 extends over the semiconductor fins 533 and 534, and the gate layer 553 extends over the semiconductor fins 511, 524, 523, 522, and 521.

Although not shown, a gate dielectric layer is disposed between a gate layer and a semiconductor fin which the gate layer extends over such that the gate layer is electrically isolated from the semiconductor fin. The semiconductor fin is heavily doped with impurities at opposite ends uncovered by the gate layer, such that the heavily doped regions of the semiconductor fin act as source and drain regions while a lightly doped region or an undoped region covered by the gate electrode acts as a channel. Thus, a transistor including a channel, source and drain regions, gate dielectric layer, and a gate layer is formed.

Referring to FIG. 4, the first portion 101 of the layout of the memory cell shows a plurality of transistors including first and second pull-up transistors PU1 and PU2, first and third pull-down transistors PD1 and PD3, second and fourth pull-down transistors PD1 and PD2, and first through fourth pass-gate transistors PG1 through PG4. The gate electrodes of the first pull-up transistor PU1 and the first and third pull-down transistors PD1 and PD3 are formed by the gate layer 553. The gate electrodes of the second pull-up transistor PU2 and the second and fourth pull-down transistors PD2 and PD4 are formed by the gate layer 543. The gate electrodes of the first through fourth pass-gate transistors PG1 through PG4 are formed by the gate layers 542, 552, 541, and 551, respectively.

According to some embodiments, some transistors such as the first through fourth pull-down transistors PD1 through PD4 and the first through fourth pass-gate transistors PG1 through PG4 each include two parallel channels; the present disclosure, however, is not limited thereto. For example, according to one embodiment, the transistor may have one channel, and according to another embodiment, the transistor may have three or more parallel channels.

As shown in FIG. 4, the memory cell has first cascaded MOSFETs including the first pass-gate transistor PG1 and the first pull down transistor PD1 formed in a first active region (i.e., the semiconductor fins 523 and 524), second cascaded MOSFETs including the second pass-gate transistor PG2 and the second pull down transistor PD2 formed in a second active region (i.e., the semiconductor fins 533 and 534), third cascaded MOSFETs including the third pass-gate transistor PG3 and the second pull down transistor PD3 formed in a third active region (i.e., the semiconductor fins 521 and 522), and fourth cascaded MOSFETs including the fourth pass-gate transistor PG4 and the second pull down transistor PD4 formed in a fourth active region (i.e., the semiconductor fins 531 and 532). Each of the first through fourth active region continuously extends between the boundaries 501 and 502.

In addition to the aforementioned semiconductor fins and the gate layers, the first portion 101 of the layout of the memory cell also includes other layers in the core level, such as gate contacts and longer contacts, through which interconnections among the plurality of transistors of the memory cell can be implemented. A gate contact (see the contacts represented by the legend "Gate contact" in FIG. 4) corresponding to "Gate_Co" in FIG. 3 is formed over a gate layer to electrically connect the gate layer to Via0 or electrically connect the gate layer to a longer contact labeled as "contact" in FIG. 3. A longer contact (see the contacts represented by "Longer contact" in FIG. 4 and the contacts represented by "Contact" in FIG. 3) having a rectangular shape in the layout view may have a thickness greater than a gate contact (see FIG. 3) such that the longer contact may be able to connect source or drain region or a silicide layer over the source or drain region to Via0 or to be able to electrically connect to a gate layer through a gate contact formed thereon.

Referring to FIG. 4, the first portion 101 of the layout of the memory cell according to embodiments of the present disclosure includes first wordline contacts WL-A each including a gate contact and a Via0 formed over the gate layers 542 and 552, and second wordline contacts WL-B each including a gate contact and a Via0 formed over the gate layers 541 and 551.

The drain regions of the first pass-gate PG1 and the first pull-down transistor PD1 can be electrically connected to the gate layer 543 through a first local connection pad 591 for data storage and local interconnection. The first local connection pad 591 includes a longer contact over the drain regions of the first pass-gate PG1 and the first pull-down transistor PD1 and a gate contact over the gate layer 543. Similarly, the drain regions of the second pass-gate PG2 and the second pull-down transistor PD2 can be electrically connected to the gate layer 553 through a second local connection pad 592 for data storage and local interconnection. The second local connection pad 592 includes a longer contact over the drain regions of the second pass-gate PG2 and the second pull-down transistor PD2 and a gate contact over the gate layer 553.

The memory cell also includes a first Vss contact 571 including a longer contact formed over the source regions of the first and third pull-down transistors PD1 and PD3 and a Via0, a second Vss contact 572 including a longer contact formed over the source regions of the second and fourth pull-down transistors PD2 and PD4 and a Via0, a first Vdd contact 573 including a longer contact formed over the source region of the first pull-up transistor PU1 and a Via0, and a second Vdd contact 574 including a longer contact formed over the source region of the second pull-up transistor PU2 and a Via0.

Referring to FIG. 4, the layout of the memory cell includes a first bitline contact 581 including a longer contact over the source region of the first pass-gate transistor PG1 and a Via0, a second bitline contact 582 including a longer contact over the source region of the second pass-gate transistor PG2 and a Via0, a third bitline contact 583 including a longer contact over the source region of the third pass-gate transistor PG3 and a Via0, and a fourth bitline contact 584 including a longer contact over the source region of the fourth pass-gate transistor PG4 and a Via0.

Other elements shown in the first portion 101 of the layout of the memory cell denoted by reference numbers 141 through 144, 171 through 173, and 181 through 184 are formed of the first metal layer M1 and will be described with reference to FIG. 5A.

Figure 5A:
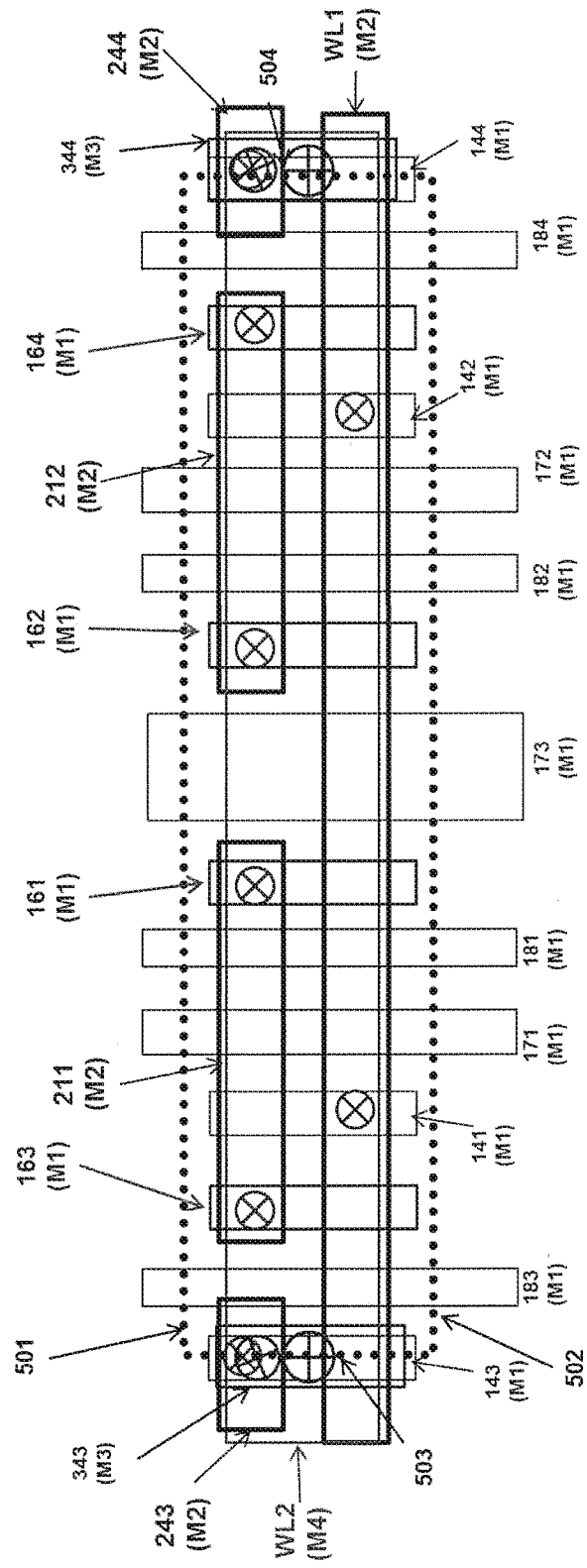
FIG. 5A illustrates a second portion of the layout of the memory cell according to embodiments of the present disclosure.
Figure 5B:
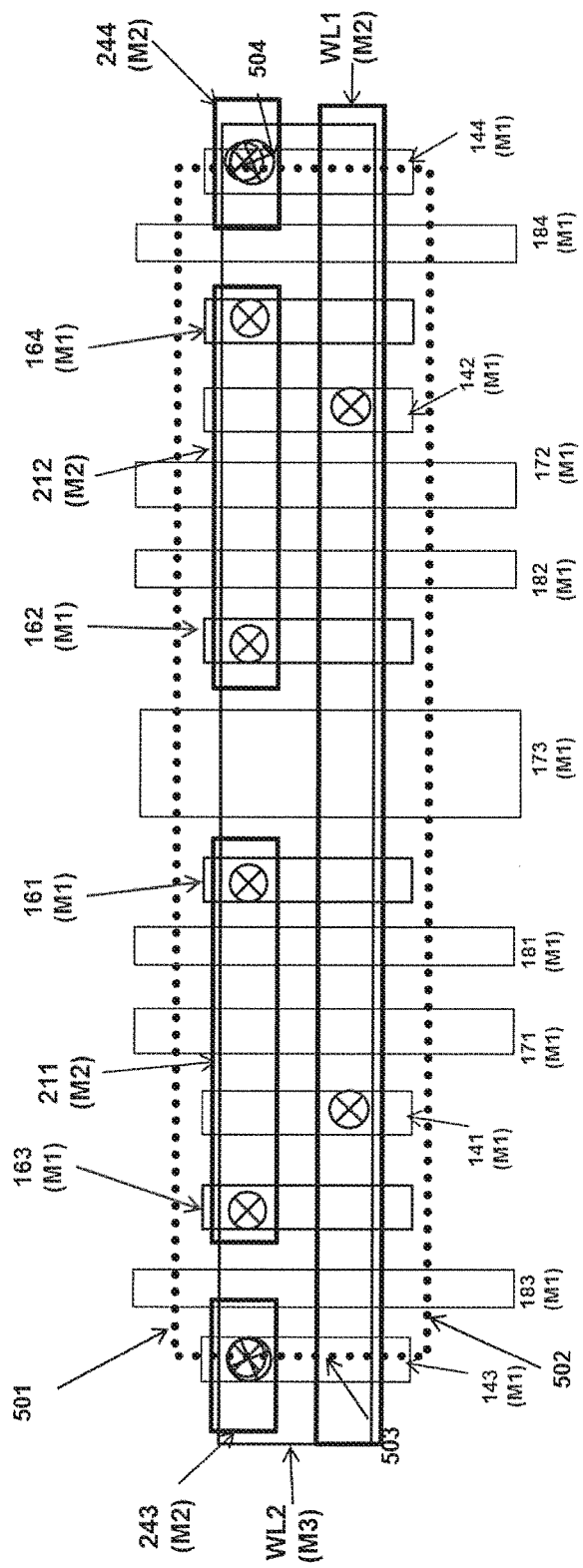
FIGS. 5B through 5D each illustrate a modified example of the second portion of the layout of the memory cell according to embodiments of the present disclosure.

FIG. 5A illustrates a second portion 102A of a layout of metal layers at the first metal layer M1 and above and vias therebetween of the memory cell according to embodiments of the present disclosure. It should be understood that separately illustrating the first and second portions 101 and 102A of the layout of the memory cell according to embodiments of the present disclosure in FIGS. 4 and 5A is merely for convenience of explanation. A skilled person in the field should recognize that the second portion 102A of the layout shown in FIG. 5A can be superimposed onto the portion of the first portion 101 of the layout shown in FIG. 4 in a manner in which the boundaries or the various metal lines having the same reference numerals are aligned to each other, such that an integral layout (not including the redundant layers shown in both FIGS. 4 and 5A) of the memory cell according to embodiments of the present disclosure can be obtained.

Referring to FIG. 4 and FIG. 5A, the first bitline 181 of the memory cell is formed over the first bitline contact 581 so as to electrically connect to the source region of the first pass-gate transistor PG1, the second bitline 182 of the memory cell is formed over the second bitline contact 582 so as to electrically connect to the source region of the second pass-gate transistor PG2, the third bitline 183 formed over the third bitline contact 583 so as to electrically connect to the source region of the third pass-gate transistor PG3, and the fourth bitline 184 formed over the fourth bitline contact 584 so as to electrically connect to the source region of the fourth pass-gate transistor PG4. The first through fourth bitlines are formed of the first metal layer M1.

The first metal layer M1 also includes a first Vss supply line 171 electrically connected to the source regions of the first and third pull-down transistors PD1 and PD3 through the first Vss contact 571, a second Vss supply line 172 electrically connected to the source regions of the second and fourth pull-down transistors PD2 and PD4 through the second Vss contact 572, and a Vdd supply line 173 electrically connected to the source regions of the first and second pull-up transistors PU1 and PU2 through the first and second Vdd contacts 573 and 574 as shown in FIG. 4. According to some embodiments, the first and second Vss power lines 171 and 173 correspond to the aforementioned power line CVss and the Vdd supply line 173 corresponds to the aforementioned power line CVdd shown in the circuit diagrams of FIGS. 1 and 2.

Referring to FIGS. 4 and 5A, the first metal layer M1 further forms first through fourth wordline landing pads 141 through 144. The first and second wordline landing pads 141 and 142 are formed over the first wordline contacts WL-A such that the first wordline landing pad 141 is electrically connected to the gate layer 542 and the second wordline landing pad 142 is electrically connected to the gate layer 552. Thus, the first and second wordline landing pads 141 and 142 are electrically connected to the gate electrodes of the first and second pass-gate transistors PG1 and PG2, respectively. The third and fourth wordline landing pads 143 and 144 are formed over the second wordline contacts WL-B such that the third wordline landing pad 143 is electrically connected to the gate layer 541 and the fourth wordline landing pad 144 is electrically connected to the gate layer 551. Thus, the third and fourth wordline landing pads 143 and 144 are electrically connected to the gate electrodes of the third and fourth pass-gate transistors PG3 and PG4, respectively.

The memory cell additionally includes a first data node landing pad 161 formed of the first metal layer M1 and electrically connected to the first local connection pad 591 through a Via0 therebetween such that the first data node landing pad 161 is electrically connected to the drain regions of the first pass-gate transistor PG1 and the first pull-down transistor PD1, and a second data node landing pad 162 formed of the first metal layer M1 and electrically connected to the second local connection pad pad 592 through a Via0 therebetween such that the second data node landing pad 162 is electrically connected to the drain regions of the second pass-gate transistor PG2 and the second pull-down transistor PD2. Moreover, the memory cell has a third data node landing pad 163 formed of the first metal layer M1 and electrically connected to the drain regions of the third pass-gate transistor PG3 and the third pull-down transistor PD3 through a longer contact over the drain regions of the third pass-gate transistor PG3 and the third pull-down transistor PD3 and also through a Via0, and a fourth data node landing pad 164 formed of the first metal layer M1 and electrically connected to the drain regions of the fourth pass-gate transistor PG4 and the fourth pull-down transistor PD4 through a longer contact over the drain regions of the fourth pass-gate transistor PG4 and the fourth pull-down transistor PD4 and also through a Via0.

As shown in FIGS. 4 and 5A, each of the bitlines 181 through 184 and each of the power lines 171 through 173 cross the boundaries 501 and 502. Thus, when more memory cells are disposed immediately adjacent the memory cell having the layout illustrated in FIGS. 4 and 5, the bitlines and the power lines of the memory cells in the same column are continuously formed. On the other hand, since each of the first through fourth wordline landing pads 141 through 144 and each of the first through fourth data node landing pads 161 through 164 do not cross any of the boundaries 501 and 502, the first through fourth wordline landing pads 141 through 144 and the first through fourth data node landing pads 161 through 164 of the memory cells in the same column are separated from each other and serve as local connection in the memory cell.

Referring to FIGS. 4 and 5A, the memory cell includes a first wordline WL1 extending across the boundaries 503 and 504 and formed of the second metal layer M2, and a second wordline WL2 extending across the boundaries 503 and 504 and formed of the fourth metal layer M4. The first wordline WL1 is formed in a region between the boundaries 501 and 502 and overlaps the gate layers 551, 552, and 553. The second wordline WL2 is formed in a region between the boundaries 501 and 502, has a width greater than that of the first wordline WL1, and covers all the gate layers.

The first wordline WL1 is electrically connected to the electrode layer 542 corresponding to the gate electrode of the first pass-gate transistor PG1 through the first wordline contact WL-A below the first metal layer M1, the first wordline landing pad 141 formed of the first metal layer M1, and a Via1 immediately over the first wordline landing pad 141. The first wordline WL1 is also electrically connected to the electrode layer 552 corresponding to the gate electrode of the second pass-gate transistor PG2 through the first wordline contact WL-A below the first metal layer M1, the second wordline landing pad 142 formed of the first metal layer M1, and a Via1 immediately over the second wordline landing pad 142.

The second wordline WL2 is electrically connected to the electrode layer 541 corresponding to the gate electrode of the third pass-gate transistor PG3 through the second wordline contact WL-B below the first metal layer M1, the third wordline landing pad 143 formed of the first metal layer M1, additional wordline landing pads 243 and 343 formed of the second and third metal layers M2 and M3, respectively, and the corresponding vias Via1, Via2, and Via3. The second wordline WL2 is also electrically connected to the electrode layer 551 corresponding to the gate electrode of the fourth pass-gate transistor PG4 through the second wordline contact WL-B below the first metal layer M1, the fourth wordline landing pad 144 formed of the first metal layer M1, additional wordline landing pads 244 and 344 formed of the second and third metal layers M2 and M3, respectively, and the corresponding vias Via1, Via2, and Via3. The additional wordline landing pads 343 and 344, as shown in FIG. 5A, cross the boundaries 503 and 504, respectively, but do not cross any of the boundaries 501 and 502. In other embodiments, for example, the embodiment shown in FIG. 5D to be described later, the additional wordline landing pads 343 and 344 may be modified to cross the boundaries 501 and 502.

Thus, the first and second wordlines WL1 and WL2 are connected to the first and second pass-gate transistors PG1 and PG2 and to the third and fourth pass-gate transistors PG3 and PG4, respectively, are formed of the first and fourth metal layers M1 and M4 at different levels, and overlap each other in the laminated direction of the memory cell. Each of the first and second wordlines WL1 and WL2 extends across the boundaries 503 and 504. Thus, when more memory cells are disposed immediately adjacent the memory cell having the first and second portions 101 and 102A of the layout, the wordlines of the memory cells in the same row are continuously formed.

Referring still to FIG. 5A, the second portion 102A of the layout shows that the second metal layer M2 also includes a first local connection line 211 electrically connected to the first and third data node landing pads 161 and 163 through Via1 thereon. Accordingly, the drain electrodes of the first and third pull-down transistors PD1 and PD3 and the first and third pass-gate transistors PG1 and PG3, and the gate electrodes of the second pull-up transistor PU2 and the second and fourth pull-down transistors PD2 and PD4, are electrically connected to each other. A second local connection line 212 formed of the second metal layer M2 is electrically connected to the second and fourth data node landing pads 162 and 164 through Via1 thereon. Thus, the drain electrodes of the second and fourth pull-down transistors PD2 and PD4 and the second and fourth pass-gate transistors PG2 and PG4, and the gate electrodes of the first pull-up transistor PU1 and the first and third pull-down transistors PD1 and PD3, are electrically connected to each other.

The first and second local connection lines 211 and 212 and the additional wordline landing pads 243 and 244 are formed of the second metal layer M2 and aligned to each other in a direction parallel to the boundary 501 or 502. That is, the first and second local connection lines 211 and 212 and the additional wordline landing pads 243 and 244 may be formed by cutting a single continuously extending pattern of the second metal layer M2. According to some embodiments, a minimum distance between the first local connection line 211 and the additional wordline landing pad 243 or a minimum distance between the second local connection line 212 and the additional wordline landing pad 244 is less than, for example, 30 nm, such that the first local connection line 211 further extends toward the boundary 503 to secure electrical connection between the first local connection line 211 and the vial on the third data node landing pad 163 and the second local connection line 212 further extends toward the boundary 504 to secure electrical connection between the second local connection line 212 and the vial on the fourth data node landing pad 164.

FIG. 5B is a modified example of the second portion 102A of the layout illustrated in FIG. 5A. Hereinafter, descriptions of configurations overlapping the configuration described above with reference to FIG. 5A will be omitted, and only the components configured differently will be described.

Referring to FIG. 5B, in the modified second portion 102B of the layout, the second wordline WL2 has substantially the same layout as that shown in FIG. 5A. The second wordline WL2 in the modified second portion 102B of FIG. 5B is formed of the third metal layer M3. In this case, the wordline landing pads 343 and 344 formed of the third metal layer M3 shown in FIG. 5A are omitted in FIG. 5B. According to some embodiments, although not shown, the fourth metal layer M4 can also be omitted or may be used to route bitline lines or power lines of the memory cell.

A skilled person in the field should recognize that the second portion 102B of the layout shown in FIG. 5B can be superimposed onto the first portion 101 of the layout shown in FIG. 4 in a manner in which the boundaries or the various metal lines having the same reference numerals are aligned to each other, such that an integral layout (not including the redundant layers shown in both FIGS. 4 and 5B) of the memory cell according to embodiments of the present disclosure can be obtained.

Figure 5C:
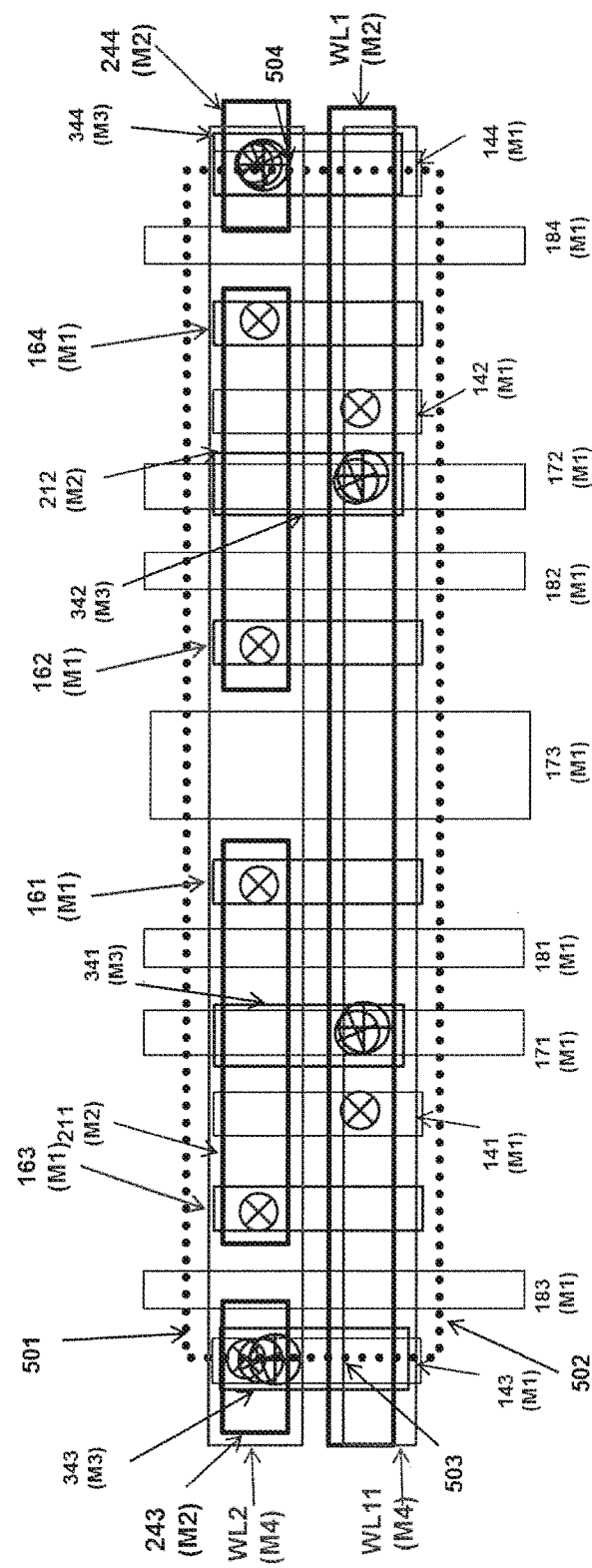

FIG. 5C is another modified example of the second portion 102A of the layout illustrated in FIG. 5A. Hereinafter, descriptions of configurations overlapping the configuration described above with reference to FIG. 5A will be omitted, and only the components configured differently will be described.

Referring to FIG. 5C, the second wordline WL2 has substantially the same layout as that shown in FIG. 5A. The second wordline WL2 in the modified second portion 102C of the layout shown in FIG. 5C has a narrower width than that in the second portion 102A of the layout shown in FIG. 5A such that the second wordline WL2 shown in FIG. 5C does not cover the gate layers 551, 552, and 553, leaving space to form additional metal line at the fourth metal layer M4. The first wordline WL1 formed of the second metal layer M2 can be electrically to another metal line WL11 formed of the fourth metal layer M4 through another wordline landing pad 341 and the corresponding Via2 and Via3, and optionally, also through another wordline landing pad 342 and the corresponding Via2 and Via3. The other wordline landing pads 341 and 342, like the additional wordline landing pads 343 and 344, formed of the third metal layer M3 and do not cross any of the boundaries 501 and 502. According to some embodiments, the metal line WL11, formed of the same metal layer as the second wordline WL2 and parallel to the second wordline WL2, can also act as the first wordline described with reference to the circuit diagrams shown in FIGS. 1 and 2.

According to some embodiments, a width of the second wordline WL2 is at least 10% greater than a width of the metal line WL11, such that an electrical resistance of the second wordline WL2 and an electrical resistance of the parallel connected first wordline WL1 and the metal line WL11 may be balanced. When the width of the second wordline WL2 is not 10% greater than the width of the metal line WL11, the electrical resistance of the second wordline WL2 may be significantly increased while the electrical resistance of the parallel connected first wordline WL1 and the metal line WL11 may be reduced, which may impact the cell speed/performance due to the unbalance word-line resistance.

A skilled person in the field should recognize that the modified second portion 102C of the layout shown in FIG. 5C can be superimposed onto the first portion 101 of the layout shown in FIG. 4 in a manner in which the boundaries or the various metal lines having the same reference numerals are aligned to each other, such that an integral layout (not including the redundant layers shown in both FIGS. 4 and 5C) of the memory cell according to embodiments of the present disclosure can be obtained.

Figure 5D:
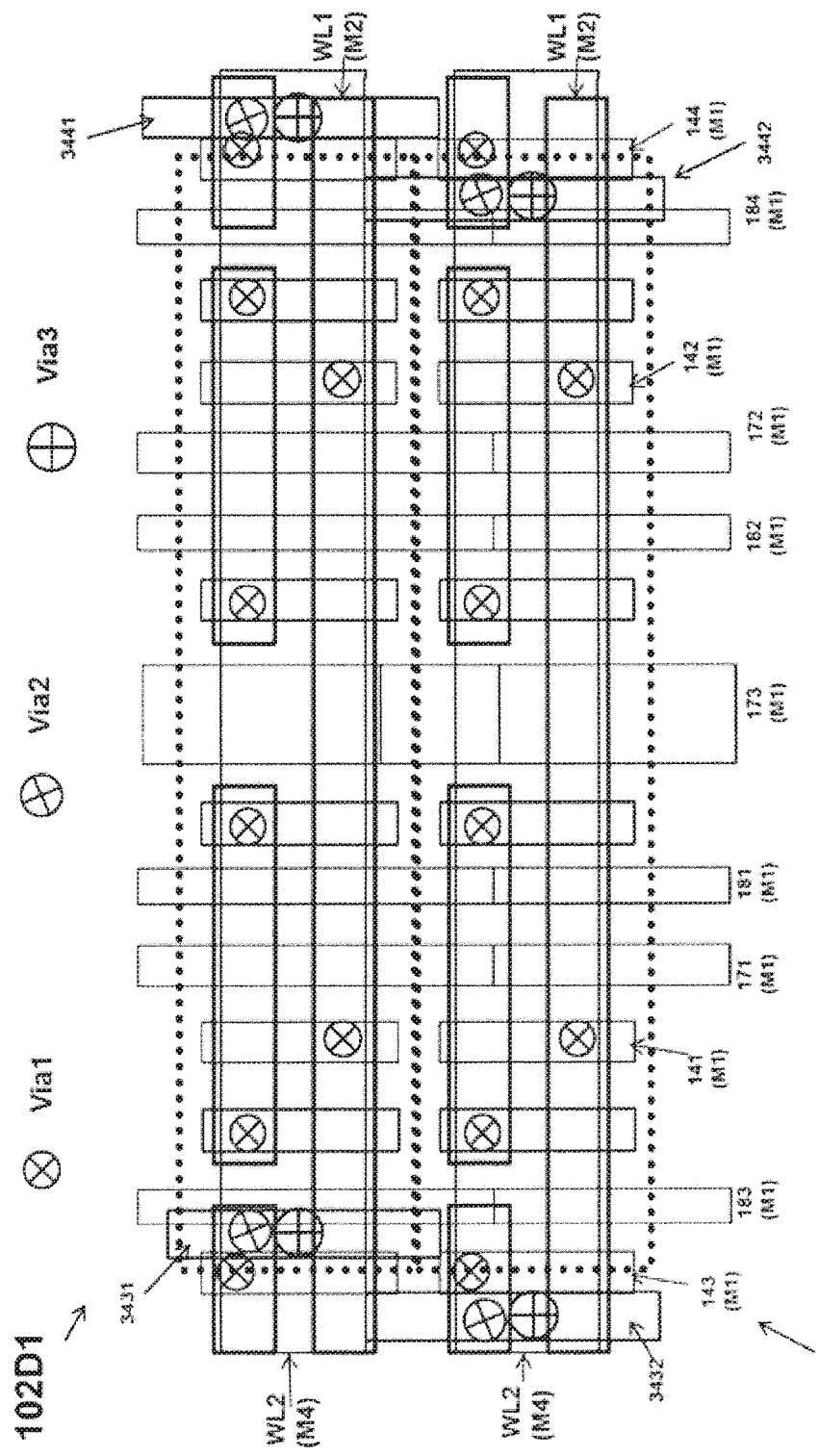

FIG. 5D is another modified example of the second portion 102A of the layout illustrated in FIG. 5A. For convenience of description, the modified second portions 102D1 and 102D2 of the layout of two immediately adjacent memory cells in the column direction of the memory device are depicted in FIG. 5D and have their common boundaries aligned to each other. It should be appreciated that each of the modified second portions 102D1 and 102D2 of the layout is the same as the second portion 102A of the layout shown in FIG. 5A, except that the wordline landing pads 343 and 344 in the second portion 102A of the layout are located differently in the modified second portions 102D1 and 102D2 of the layout. Hereinafter, descriptions of configurations overlapping the configuration described above with reference to FIG. 5A will be omitted, and only the components configured differently will be described.

Referring to FIGS. 5A and 5D, the wordline landing pad 343, as well as the corresponding vias Via2 and Via3, in the second portion 102A of the layout shown in FIG. 5A is moved, for example, toward the Vdd supply line 173, becoming a wordline landing pad 3431 in the modified second portion 102D1 of the layout in FIG. 5D. The wordline landing pad 343, as well as the corresponding vias Via2 and Via3, in the second portion 102A of the layout shown in FIG. 5A is moved, for example, away from the Vdd supply line 173, becoming a wordline landing pad 3432 in the modified second portion 102D2 shown in FIG. 5D. The wordline landing pad 344, as well as the corresponding vias Via2 and Via3, in the second portion 102A of the layout shown in FIG. 5A is moved, for example, away from the Vdd supply line 173, becoming a wordline landing pad 3441 in the modified second portion 102D1 of the layout shown in FIG. 5D. The wordline landing pad 344, as well as the corresponding vias Via2 and Via3, in the second portion 102A of the layout shown in FIG. 5A is moved, for example, toward the Vdd supply line 173, becoming a wordline landing pad 3442 in the modified second portion 102D2 of the layout shown in FIG. 5D.

A skilled person in the field should recognize that the modified second portions 102D1 and 102D2 of the layout shown in FIG. 5D can be superimposed onto two replicated first portions 101 of the layout shown in FIG. 4 in a manner in which the boundaries or the various metal lines having the same reference numerals are aligned to each other, such that an integral layout (not including the redundant layers shown in both FIGS. 4 and 5D) of the memory cell according to embodiments of the present disclosure can be obtained.

Figure 6:
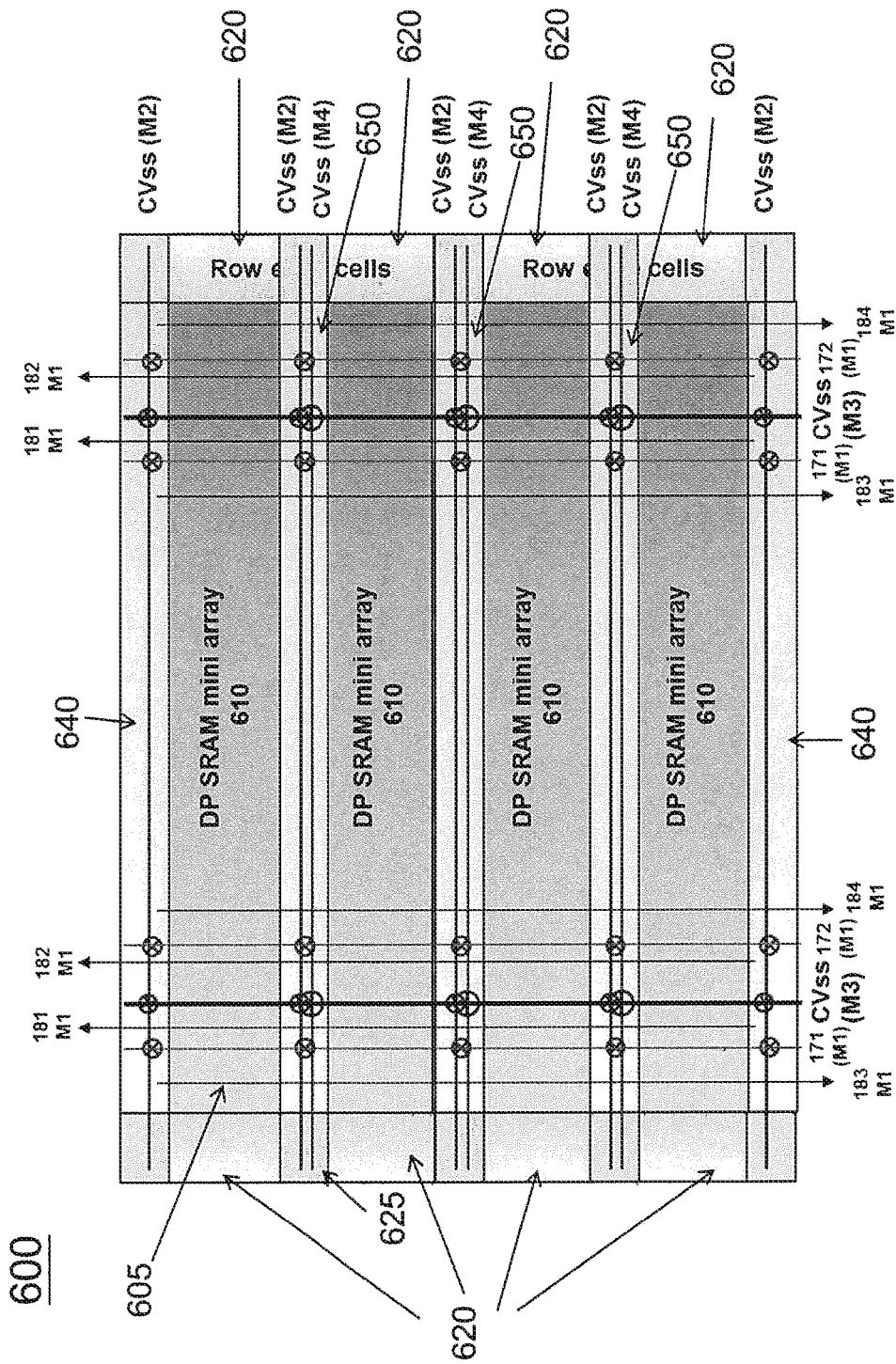
FIG. 6 is a schematic diagram of a cell array of a memory device according to embodiments of the present disclosure.

FIG. 6 is a schematic diagram of a cell array of a memory device according to embodiments of the present disclosure. The cell array 600 includes a device region 605 in which a plurality of memory cells each having the aforementioned layout are arranged in a matrix form. The device region 605 is surrounded by row edge regions 620 in which non-memory cells such as dummy cells may be formed and also by column edge regions 640 in which edge wells and power mesh cells can be formed.

According to some embodiments, the cell array 600 may have one or more power mesh stripes 650 separating the plurality of memory cells. That is, the device region 605 can be divided into a plurality of sub regions by the one or more power mesh strips 650. In each of the sub regions of the device region 605, a mini array 610 of memory cells having an array size of 4×4 or more can be formed. In some embodiments, the power stripe 650 having the same size as one row of the memory cells may be evenly distributed between the column edge regions 640 located at the opposite ends of the device region 605, although the present disclosure is not limited thereto. According to some embodiments, the column edge region 640 may have the same size as the power stripe 650. To minimize voltage variation along power transmission, power mesh cells based on modified memory cell can be formed in the column edge region 640 and the one or more power mesh regions. The layout of the power mesh cells based on the modification of the above described layouts of the memory cell will be more apparent with reference to FIGS. 7A and 7B.

Figure 7A:
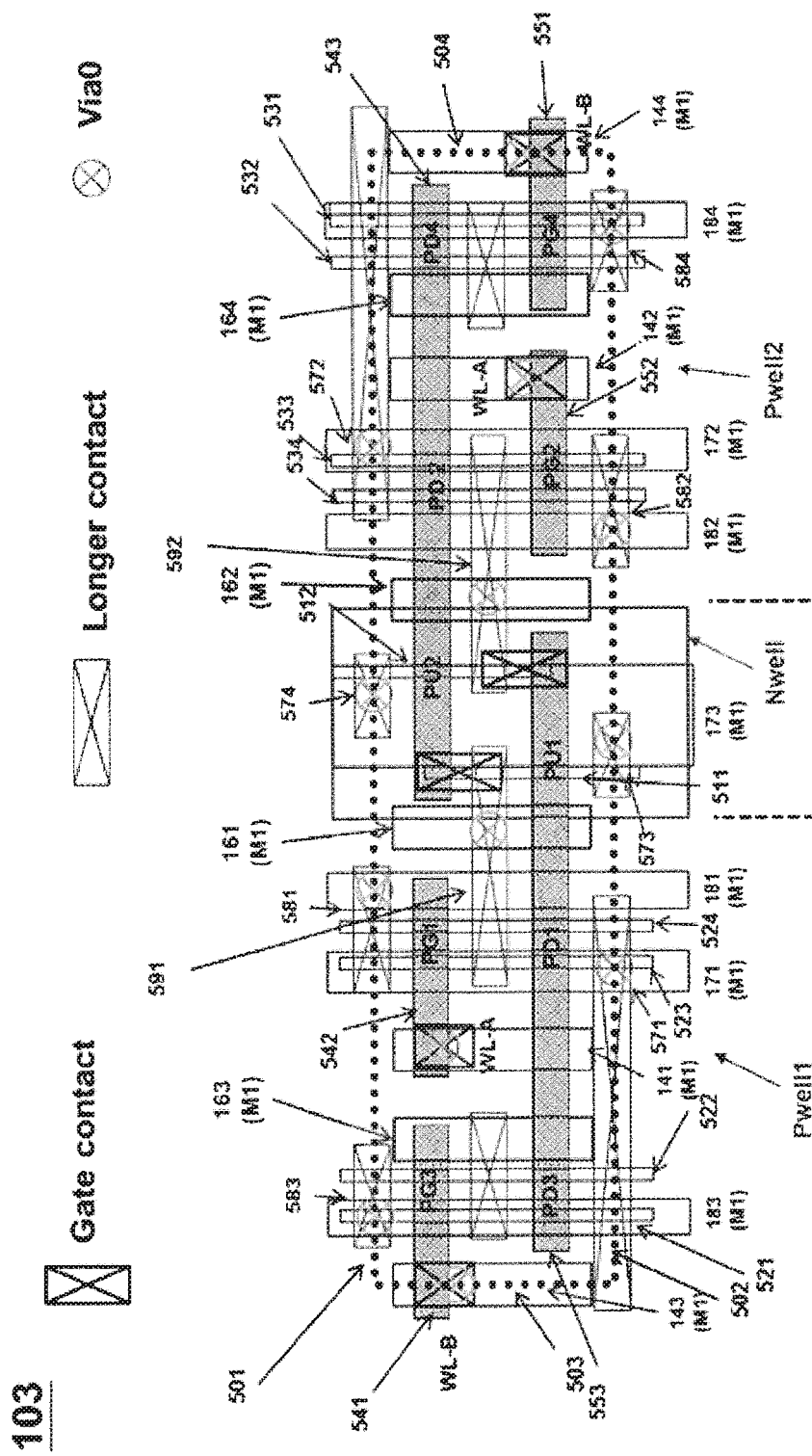
FIGS. 7A and 7B illustrate first and second portions of a layout of a power mesh cell according to embodiments of the present disclosure.
Figure 7B:
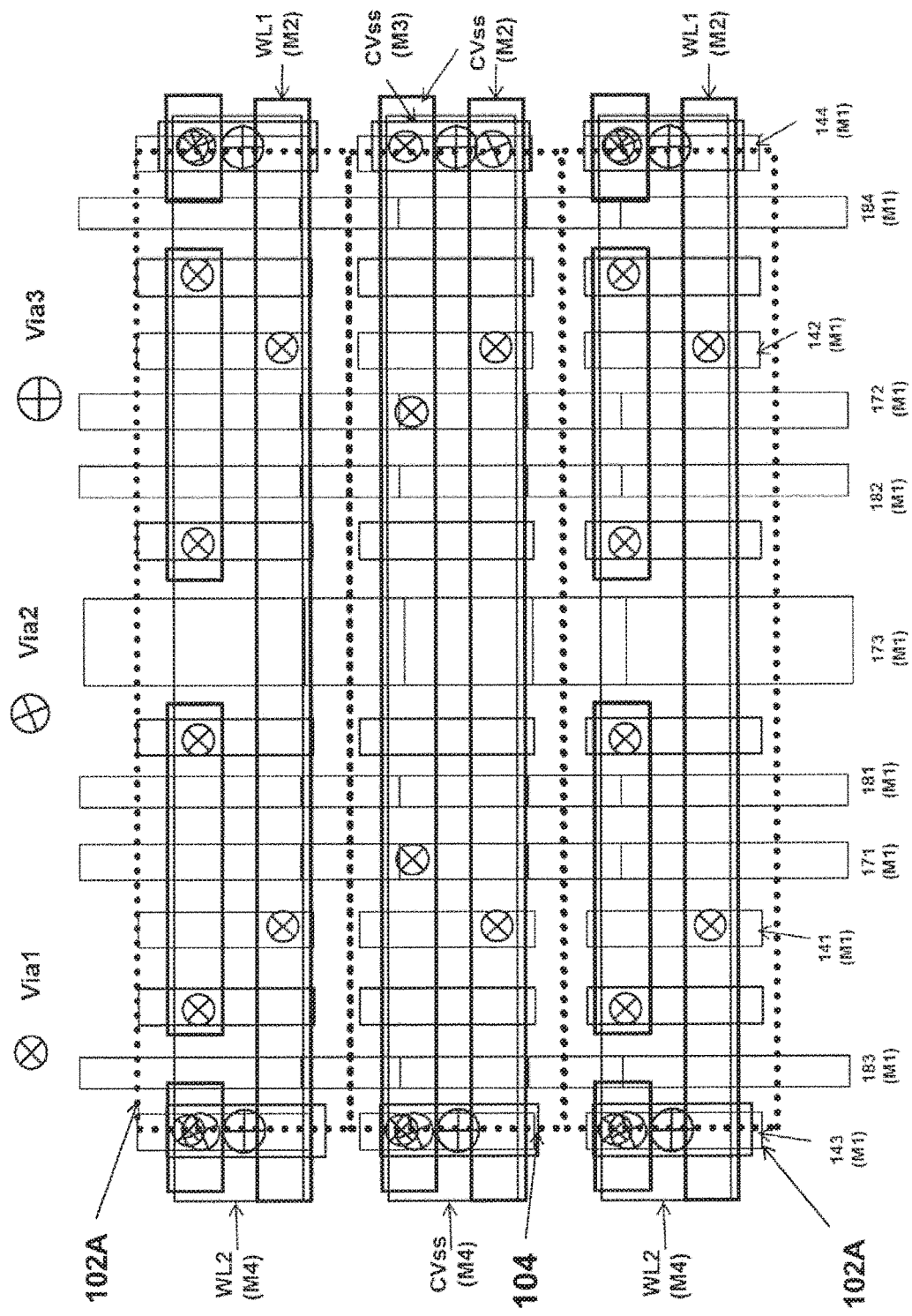

FIG. 7A illustrates a first portion of a layout of a power mesh cell according to embodiments of the present disclosure, and FIG. 7B illustrates a second portion of the layout of metal layers at the level of the first metal layer M1 and above and vias therebetween. A skilled person in the field should recognize that a second portion 104 of the layout shown in FIG. 7B can be superimposed onto a first portion 103 of the layout shown in FIG. 7A in a manner in which the boundaries or the various metal lines having the same reference numerals are aligned to each other, such that an integral layout (not including the redundant layers shown in both FIGS. 7A and 7B) of the power mesh cell according to embodiments of the present disclosure can be obtained.

The first portion 103 of the layout of the power mesh cell according to embodiments of the present disclosure is substantially the same as the first portion 101 of the layout of the memory cell shown in FIG. 4. The Via0 connecting the third data node landing pad 163 and the longer contact therebelow in the first portion 101 of the layout shown in FIG. 4 is omitted in the first portion of the layout shown in FIG. 7A and the Via0 connecting the fourth data node landing pad 164 and the longer contact therebelow in the portion of the first portion 101 of the layout shown in FIG. 4 is omitted in the first portion of the layout shown in FIG. 7A. By omitting the aforementioned Via0, the interconnection of the memory cell is broken and the structure of the memory cell can be converted to a power mesh cell with additional modification to the metal layers which will be described with reference to FIG. 7B. It should be understood that omitting the aforementioned Via0 is an example; the present disclosure, however, is not limited thereto. For another example, instead of omitting the aforementioned Via0, the longer contacts immediately below the Via0 shown in FIG. 4 can be omitted as an alternative to the first portion 103 of the layout shown in FIG. 7A.

Now referring to FIG. 7B in which two second portions 102A of the layout shown in FIG. 5A are disposed at the opposite sides of the second portion 104 of the layout in the column direction and aligned to the boundaries thereof. The second portion 104 of the layout of the power mesh cell is similar to the second portion 102A of the layout of the memory cell, but the internal connection thereof is different from that of the second portion 102A of the layout. The second portion 104 of the layout includes two parallel power lines CVss formed of the second metal layer M2. One of the two power lines CVss formed of the second metal layer M2 is electrically connected to the first and second Vss supply lines 171 and 172 through Via1 disposed on the first and second Vss supply lines 171 and 172. The power line CVss formed of the fourth metal layer M4, the landing pads, and vias thereon can electrically connect the two parallel power lines CVss formed of the second metal layer M2 to each other.

Referring back to FIG. 6, in each of the power mesh stripe 650, the power lines CVss formed of the second and fourth metal layers M2 and M4 extend to portions 625 of the row edge regions 620. Thus, a reference voltage, such as a ground voltage, can be applied to memory cells through at least one of the power lines CVss formed of the second and fourth metal layers M2 and M4 and also through the first and second Vss supply lines 171 and 173.

Figure 8:
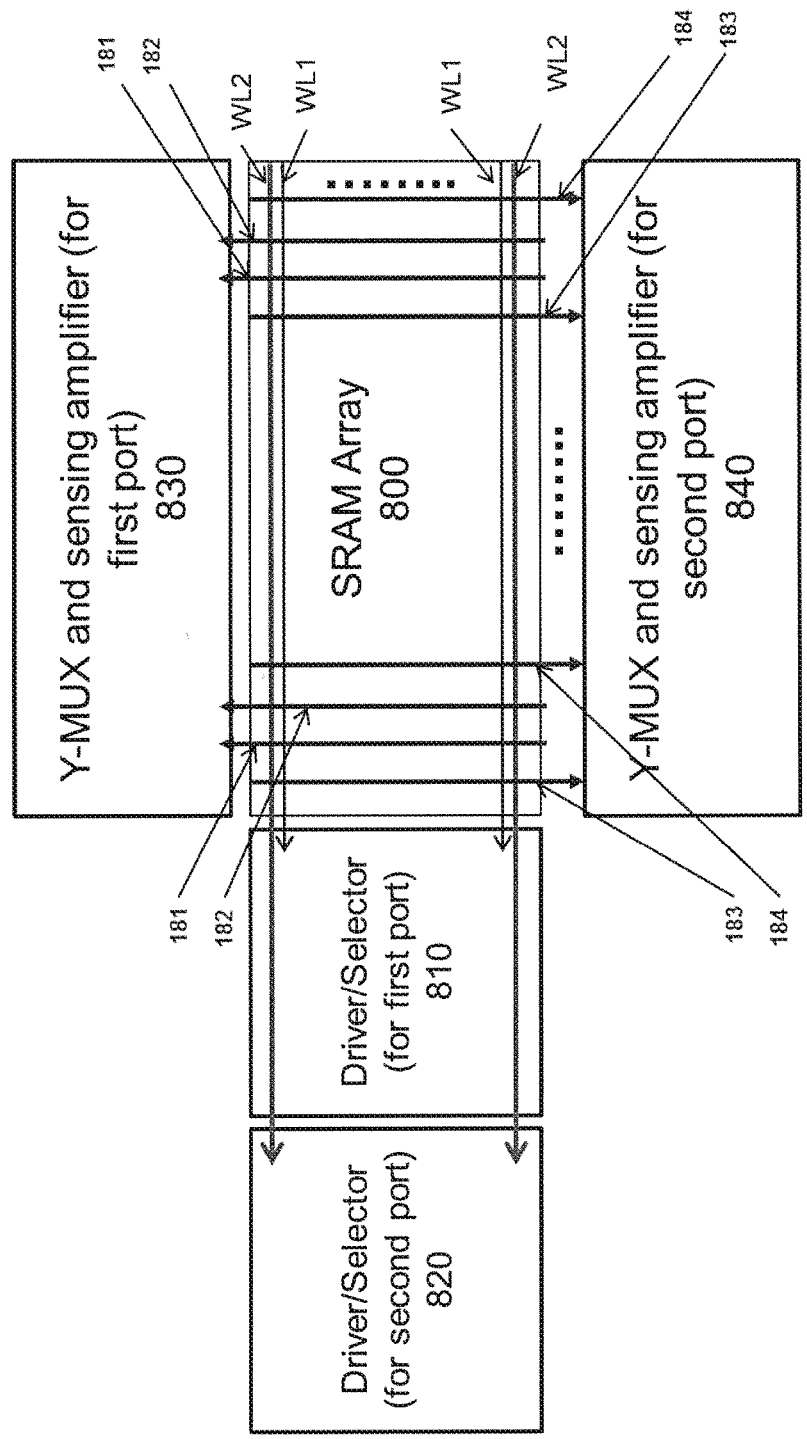
FIG. 8 is a circuit block of an SRAM device according to embodiments of the present disclosure.

FIG. 8 is a circuit block of an SRAM device according to embodiments of the present disclosure. As shown in FIG. 8, the SRAM device includes an SRAM array 800 comprised of 4×4 or more dual-port SRAM cells each having one of the aforementioned cell layouts. The first wordlines WL1 of the dual-port SRAM cells are connected to and controlled by a first port wordline driver/selector 810, and the second wordlines WL2 of the dual-port SRAM cells are connected to and controlled by a second port wordline driver/selector 820. According to various aforementioned embodiments, the first and second wordlines WL1 and WL2 of the dual-port SRAM cells are formed at different metal levels. As way of example, the first wordline WL1 is formed of the second metal layer M2 and the second wordline WL2 is formed of the fourth metal layer M4.

Still referring to FIG. 8, the first bitline 181 and the second bitline 182 of the dual-port SRAM cells are connected to a first port Y-multiplexer and sensing amplifier 830. The first and second bitlines 181 and 182 of a memory cell, the wordline WL1 of which is selected by the first port wordline driver/selector 810, can be selected and data transmitted thereof can be read and sensed (or written) by the first port Y-multiplexer and sensing amplifier 830. The third and fourth bitlines 183 and 184 of the dual-port SRAM cells are connected to a second port Y-multiplexer and sensing amplifier 840. The third and fourth bitlines 183 and 184 of the memory cell, the wordline WL1 of which is selected by the second port wordline driver/selector 820, can be selected and data transmitted thereof can be read and sensed (or written) by the second port Y-multiplexer and sensing amplifier 840. According to various embodiments according to the present disclosure, the first through fourth bitlines 181 through 184 of the dual-port SRAM cells can be formed by the same metal layer, for example, the first metal layer M1.

Although not shown in FIG. 8, the SRAM array 800 includes memory cells having the aforementioned memory cell layout, and may further include the aforementioned power stripes (or power mesh cells) between rows of memory cells. The first and second port wordline driver/selectors 810 and 820 according to some embodiments can alternatively be disposed at opposite sides of the SRAM array 800.

According to one aspect of the present disclosure, a memory device including a plurality of memory cells and optional one or more power mesh stripes (or power mesh cells) includes individual patterns each have a straight line shape. That is, without considering any processing errors, the individually pattern may linearly extend along either column direction or row direction, but without any bending portions. Thus, the memory device has lithography patterns can be implemented by 10 nm or beyond technologies with an improved yield and reduced manufacturing costs.

According to another aspect of the present disclosure, the memory device including a plurality of memory cells and optional one or more power mesh stripes (or power mesh cells) and having intra-node connection structure with improved wordline routing structures, can be patterned by 193-nm-immersion lithography without using more expensive and advanced E-beam lithography or extreme ultraviolet lithography (EUV) tool.

According to another aspect of the present disclosure, the intra-nodes connection structure for lithography friendly cell layout use first and second metal layers M1/M2 for forming landing pads (or longer contacts) as a local connection lines to connect drain regions of transistors (for example, PU1, PD1, PG1, and PG3 in the accompanying drawings) to each other. Accordingly, each memory cell has two wordlines formed of metal layers. For example, the first wordline (WL1 in the accompanying drawings) is formed of the second metal layer M2 and the second wordline (WL2 in the accompanying drawings) can be formed of a metal layer above the second metal layer M2. The second wordline may have a lowered metal routing resistance if the width thereof is increased.

According to another aspect of the present disclosure, the memory cells and optional power mesh cells of the memory device are compatible to spacer lithography in both back end of line (BEOL) and front-end-of-line (FEOL) routing. Spacer lithography comparable (or uni-directional routing rule comparable) metal routing may also be implemented to manufacture thin-style (the cell ratio of cell X-Y pitches is large than 5) three-port SRAM cells.

According to one aspect of the present disclosure, the memory cells and optional one or more power mesh stripes (or power mesh cells) of a memory device have a spacer lithography compatible layout. For example, each cell has a single routing orientation for individual semiconductor fins, gate layers, and various metal layers. The various metal layers have no wide island or bent structures. More specifically, the semiconductor fins and the patterns of the first and third metal layers extend parallel or substantially parallel to one direction, while the patterns of the gate layers and the second and fourth metal layers extend parallel or substantially parallel to another direction which is perpendicular or substantially perpendicular to the one direction. The memory device supports single orientation metal routing which requires the same metal routing scheme for both memory cells and logic circuits.

According to another aspect of the present disclosure, the memory device has reduced bitline coupling capacitance and cross-talk noise, since the bitlines are fully shielded and have a minimum routing distance.

According to another aspect of the present disclosure, each memory cell of the memory device has a balanced layout to improve memory cell stability.

According to another aspect of the present disclosure, the memory cells and power mesh cells of the memory device have the height and same area. Thus, no additional consideration is required to implement routing of the various layers in each power mesh cell.

According to an aspect of the present disclosure, a dual-port static random access memory (SRAM) cell is confined in a region defined by first through fourth boundaries. The first and second boundaries are parallel to each other, and the third and fourth boundaries are connected the first and the second boundaries and parallel to each other. The dual-port SRAM includes first through third power lines, a storage unit connected to the first through third power lines, a first port comprising first and second pass-gate transistors controlled by a first wordline, the first pass-gate transistor coupling a first bitline and the storage unit to each other and the second pass-gate transistor coupling a second bitline and the storage unit to each other, and a second port comprising third and fourth pass-gate transistors controlled by a second wordline, the third pass-gate transistor coupling a third bitline and the storage unit to each other and the fourth pass-gate transistor coupling a fourth bitline and the storage unit to each other. The first through fourth bitlines and the first through third power lines each extend in a first direction and are formed of a first metal layer. The first wordline extends in a second direction substantially perpendicular to the first direction and is formed of a second metal layer above the first metal layer. The second wordline extends in the second direction and is formed of an upper-level metal layer above the second metal layer.

According to an aspect of the present disclosure, a dual-port random access memory (SRAM) cell includes a first metal layer including first through third power lines space-apart from each other, first through fourth bitlines space-apart from each other, first through fourth data node landing pads spaced-apart from each other, and first through fourth wordline landing pads spaced-apart from each other. A second metal layer includes a first wordline electrically connected to the first and second wordline landing pads through vias between the first and second metal layers, a first local connection line electrically connected to the first and third data node landing pads through vias between the first and second metal layers, a second local connection line electrically connected to the second and fourth data node landing pads through vias between the first and second metal layers, and first and second additional wordline landing pads. A upper-level metal layer above the second metal layer including a second wordline electrically connected to the third and fourth wordline landing pads at least through the additional first and second additional wordline landing pads formed of the second metal layer. Each pattern of the first metal layer extends in a first direction, and each pattern of the second metal layer extends in a second direction substantially perpendicular to the first direction.

According to an aspect of the present disclosure, a semiconductor device includes first and second arrays of memory cells in a column direction and a row direction and a row of power mesh cells each having a same size as the memory cell disposed between the first and second arrays. Each memory cell includes cross-coupled first and second invertors, the first invertor including a first pull-up transistor and parallel first and third pull-down transistors, and the second invertor including a second pull-up transistor and parallel second and fourth pull-down transistors, first and third pass-gate transistors coupled to an output of the first invertor and an input of the second invertor; and second and fourth pass-gate transistors coupled to an input of the first invertor and an output of the second invertor. In one column, the semiconductor device includes a first metal layer including a first power supply line electrically connected to source regions of the first and third pull-down transistors of memory cells in the one column, a second power supply line electrically connected to source regions of the second and fourth pull-down transistors of the memory cells in the one column, and a third power supply line electrically connected to source regions of the first and second pull-up transistors of the memory cells in the one column. In the one column, a second metal layer including one first wordline, extending in the row direction, electrically connected to gate electrodes of first and second pass-gate transistors of a first memory cell disposed on one side of a power mesh cell in the one column and another first wordline, extending in the row direction, electrically connected to gate electrodes of first and second pass-gate transistors of a second memory cell disposed on another side of the power mesh cell. In the one column, a fourth metal layer including one second wordline, extending in the row direction, electrically connected to gate electrodes of third and fourth pass-gate transistors of the first memory cell and another second wordline, extending in the row direction, electrically connected to gate electrodes of third and fourth pass-gate transistors of the second memory cell. In the one column, a third metal layer disposed between the second and fourth metal layers and including wordline landing pads extending in the column direction, disposed on the one side of the power mesh cell, and electrically connected to the second wordline of the first memory cell and wordline landing pads extending in the column direction, disposed on the other side of the power mesh cell, and electrically connected to the second wordline of the second memory cell. The second metal layer further includes an upper level first power line, disposed in the power mesh cell, electrically connected to the first and second power lines crossing the power mesh cell. The fourth metal layer further includes an upper level second power line disposed in the power mesh cell and extending in the row direction. The third metal layer further includes landing pads electrically connected to the upper level first power line and the upper level second power line.

The fin field-effect transistors as described are as an example to implement various embodiments of the present disclosure. The present disclosure should not be limited thereto. According to other embodiments, a dual-port SRAM having any of the aforementioned layouts can be implemented by any other types of transistors. One skilled in the art should recognize that the semiconductor fins as described above can be modified or replaced by various active regions suitable to manufacture the other types of transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual-port static random access memory (SRAM) cell confined in a region defined by first through fourth boundaries, the first and second boundaries parallel to each other, and the third and fourth boundaries connected the first and the second boundaries and parallel to each other, the dual-port SRAM comprising:
first through third power lines;
a storage unit connected to the first through third power lines;
a first port comprising first and second pass-gate transistors controlled by a first wordline, the first pass-gate transistor coupling a first bitline and the storage unit to each other and the second pass-gate transistor coupling a second bitline and the storage unit to each other; and
a second port comprising third and fourth pass-gate transistors controlled by a second wordline, the third pass-gate transistor coupling a third bitline and the storage unit to each other and the fourth pass-gate transistor coupling a fourth bitline and the storage unit to each other, wherein the first through fourth bitlines and the first through third power lines each extend in a first direction and are formed of a first metal layer,
the first wordline extends in a second direction substantially perpendicular to the first direction and is formed of a second metal layer above the first metal layer, and
the second wordline extends in the second direction and is formed of a upper-level metal layer above the second metal layer.

2. The dual-port SRAM cell of claim 1, wherein each of the first through fourth bitlines and the first through third power lines extends continuously from the first boundary to the second boundary, and
each of the first and second wordline extends continuously from the third boundary to the fourth boundary.

3. The dual-port SRAM cell of claim 1, further comprising third and fourth metal layers above the second metal layer,
wherein the first wordline is connected to gate electrodes of the first and second pass-gate transistors at least through wordline landing pads formed of the first metal layer,
the second wordline, formed of the fourth metal layer, is connected to gate electrodes of the third and fourth pass-gate transistors at least through wordline landing pads formed of the first through third metal layers, and
the third metal layer is disposed between the second metal layer and the fourth metal which is the upper-level metal layer.

4. The dual-port SRAM cell of claim 3, wherein each of the wordline landing pads formed of the first and third metal layers extends in the first direction, and each of the wordline landing pads formed of the second metal layer extends in the second direction.

5. The dual-port SRAM cell of claim 4, wherein each of the wordline landing pads does not contact any of the first and second boundaries.

6. The dual-port SRAM cell of claim 3, wherein the fourth metal layer only forms the second wordline, and
the second wordline covers the first wordline.

7. The dual-port SRAM cell of claim 3, further comprising a third wordline formed of the fourth metal layer, extending continuously from the third boundary to the fourth boundary in the second direction, covering the first wordline, and electrically connected to the first wordline at least through a wordline landing pad formed of the third metal layer,
wherein a width of the second wordline is at least 10% greater than a width of the third wordline.

8. The dual-port SRAM cell of claim 3, wherein a distance, from the wordline landing pad, which is formed of the first metal layer and is electrically connected to the third pass-gate transistor, to the third power line is greater than a distance, from the wordline landing pad, which is formed of the third metal layer and which is electrically connected to the third pass-gate transistor, to the third power line,
a distance, from the wordline landing pad, which is formed of the first metal layer and is electrically connected to the fourth pass-gate transistor, to the third power line is greater than a distance, from the wordline landing pad, which is formed of the third metal layer and which is electrically connected to the fourth pass-gate transistor, to the third power line, and
each of the wordline landing pads formed of the third metal layer extends continuously from the first boundary to the second boundary.

9. The dual-port SRAM cell of claim 1, further comprising a third metal layer above the second metal layer,
wherein the first wordline is connected to gate electrodes of the first and second pass-gate transistors at least through wordline landing pads formed of the first metal layer,
the second wordline, formed of the third metal layer, is connected to gate electrodes of the third and fourth pass-gate transistors at least through wordline landing pads formed of the first and second metal layers, and
each of the wordline landing pads formed of the first metal layer extends in the first direction, and each of the wordline landing pads formed of the second metal layer extends in the second direction.

10. The dual-port SRAM cell of claim 1, wherein the storage unit includes cross-coupled first and second invertors, the first invertor includes a first pull-up transistor and first and third pull-down transistors, and the second invertor includes a second pull-up transistor and second and fourth pull-down transistors,
the first pass-gate transistor and the first pull-down transistor constituting first cascaded transistors are formed in a first active region,
the second pass-gate transistor and the second pull-down transistor constituting second cascaded transistors are formed in a second active region,
the third pass-gate transistor and the third pull-down transistor constituting third cascaded transistors are formed in a third active region,
the fourth pass-gate transistor and the fourth pull-down transistor constituting fourth cascaded transistors are formed in a fourth active region,
the first pull-up transistor is formed in a fifth active region,
the second pull-up transistor is formed in a sixth active region, and
each of the first through sixth active regions continuously extends from the first boundary to the second boundary.

11. The dual-port SRAM cell of claim 10, further comprising:
a first gate layer acting as a gate electrode of the third pass-gate transistor;
a second gate layer acting as a gate electrode of the first pass-gate transistor;
a third gate layer acting as gate electrodes of the second pull-up transistor, the second pull-down transistor, and the fourth pull-down transistor;
a fourth gate layer acting as a gate electrode of the fourth pass-gate transistor;
a fifth gate layer acting as a gate electrode of the second pass-gate transistor; and
a sixth gate layer acting as gate electrodes of the first pull-up transistor, the first pull-down transistor, and the third pull-down transistor; and
first through fourth gate contacts disposed between a respective wordline landing pad formed of the first metal layer and a respective gate layer covering a portion of the respective wordline landing pad formed of the first metal layer,
wherein the first through third gate layers are spaced apart from each other and aligned to each other in the second direction, and
the fourth through fifth gate layers are spaced apart from each other and aligned to each other in the second direction.

12. The dual-port SRAM cell of claim 11, further comprising:

a first data node landing pad, drain regions of the first pass-gate transistor and the third gate layer electrically connected to each other at least through the first data node landing pad;

a second data node landing pad, drain regions of the second pass-gate transistor and the second pull-down transistor and the sixth gate layer electrically connected to each other at least through the second data node landing pad;

a third data node landing pad, drain regions of the third pass-gate transistor and the third pull-down transistor electrically connected to each other at least through the third data node landing pad; and a fourth data node landing pad, drain regions of the fourth pass-gate transistor and the fourth pull-down transistor electrically connected to each other at least through the fourth data node landing pad, wherein the first through fourth data node landing pads are formed of the first metal layer, extend in the second direction, and are spaced-apart from the first and second boundaries.

13. The dual-port SRAM cell of claim 12, further comprising:

a first local connection line formed of the second metal layer, the first and third data node landing pads electrically connected to each other at least through the first local connection line; and a second local connection line formed of the second metal layer, the second and fourth data node landing pads electrically connected to each other at least through the second local connection line, wherein the second metal layer includes first and second wordline landing pads respectively formed over the first and third gate layers, and the first wordline landing pad, the first local connection line, the second local connection line, and the second wordline landing pad are aligned to each other in the first direction.

14. The dual-port SRAM cell of claim 10, further comprising:

a first bitline contact formed of the first metal layer, the first bitline contact and a via thereon electrically connecting the first bitline to a source region of the first pass-gate transistor;

a second bitline contact formed of the first metal layer, the second bitline contact and a via thereon electrically connecting the second bitline to a source region of the second pass-gate transistor;

a third bitline contact formed of the first metal layer, the third bitline contact and a via thereon electrically connecting the third bitline to a source region of the third pass-gate transistor;

a fourth bitline contact formed of the first metal layer, the fourth bitline contact and a via thereon electrically connecting the fourth bitline to a source region of the fourth pass-gate transistor;

a first power line contact formed of the first metal layer, the first power line contact and vias thereon electrically connecting the first power line to source regions of the first and third pull-down transistors;

a second power line contact formed of the first metal layer, the second power line contact and vias thereon electrically connecting the second power line to source regions of the second and fourth pull-down transistors; and third and fourth power line contacts formed of the first metal layer, the third and fourth power line contacts and vias thereon electrically connecting the third power line to source regions of the first and second pull-up transistors, wherein the third bitline contact, the first bitline contact, the fourth power line contact, the second power line contact are sequentially disposed and aligned to each other in the second direction, and the fourth bitline contact, the second bitline contact, the third power line contact, the first power line contact are sequentially disposed and aligned to each other in the second direction.

15. A dual-port random access memory (SRAM) cell, comprising:

a first metal layer including first through third power lines space-apart from each other, first through fourth bitlines space-apart from each other, first through fourth data node landing pads spaced-apart from each other, and first through fourth wordline landing pads spaced-apart from each other;

a second metal layer including a first wordline electrically connected to the first and second wordline landing pads through vias between the first and second metal layers, a first local connection line electrically connected to the first and third data node landing pads through vias between the first and second metal layers, a second local connection line electrically connected to the second and fourth data node landing pads through vias between the first and second metal layers, and first and second additional wordline landing pads; and a upper-level metal layer above the second metal layer including a second wordline electrically connected to the third and fourth wordline landing pads at least through the additional first and second additional wordline landing pads formed of the second metal layer, wherein each pattern of the first metal layer extends in a first direction, and each pattern of the second metal layer extends in a second direction substantially perpendicular to the first direction.

16. The dual-port SRAM cell of claim 15, further comprising:

cross-coupled first and second invertors, the first invertor including a first pull-up transistor and parallel first and third pull-down transistors, and the second invertor including a second pull-up transistor and parallel second and fourth pull-down transistors;

first and third pass-gate transistors coupled to an output of the first invertor and an input of the second invertor; and second and fourth pass-gate transistors coupled to an input of the first invertor and an output of the second invertor, wherein the first through fourth bitline are electrically connected to source regions of the first through fourth pass-gate transistors, respectively, the first through third power supply line are electrically connected to source regions of the first and third pull-down transistors, source regions of the second and third pull-down transistors, and source regions of the first and second pull-up transistors, respectively, and the first and second wordlines are electrically connected to gate electrodes of the first and second pass-gate transistors and gate electrodes of the third and fourth pass-gate transistors, respectively.

17. The dual-port SRAM cell of claim 15, wherein the upper-level metal layer is a third metal layer and extends substantially parallel to the second direction.

18. The dual-port SRAM cell of claim 15, wherein the upper-level metal is a fourth metal layer and extends substantially parallel to the second direction, the dual-part SRAM cell further comprises a third metal layer between the second and fourth metal layers, and the third metal layer includes wordline landing pads extending in the first direction and electrically connected to the second wordline.

19. A semiconductor device, comprising:

first and second arrays of memory cells in a column direction and a row direction; and a row of power mesh cells each having a same size as the memory cell disposed between the first and second arrays, wherein each memory cell includes:

cross-coupled first and second invertors, the first invertor including a first pull-up transistor and parallel first and third pull-down transistors, and the second invertor including a second pull-up transistor and parallel second and fourth pull-down transistors;

first and third pass-gate transistors coupled to an output of the first invertor and an input of the second invertor; and second and fourth pass-gate transistors coupled to an input of the first invertor and an output of the second invertor, in one column, the semiconductor device includes:

a first metal layer including a first power supply line electrically connected to source regions of the first and third pull-down transistors of memory cells in the one column, a second power supply line electrically connected to source regions of the second and fourth pull-down transistors of the memory cells in the one column, and a third power supply line electrically connected to source regions of the first and second pull-up transistors of the memory cells in the one column;

a second metal layer including one first wordline, extending in the row direction, electrically connected to gate electrodes of first and second pass-gate transistors of a first memory cell disposed on one side of a power mesh cell in the one column and another first wordline, extending in the row direction, electrically connected to gate electrodes of first and second pass-gate transistors of a second memory cell disposed on another side of the power mesh cell;

a fourth metal layer including one second wordline, extending in the row direction, electrically connected to gate electrodes of third and fourth pass-gate transistors of the first memory cell and another second wordline, extending in the row direction, electrically connected to gate electrodes of third and fourth pass-gate transistors of the second memory cell; and a third metal layer disposed between the second and fourth metal layers and including wordline landing pads extending in the column direction, disposed on the one side of the power mesh cell, and electrically connected to the second wordline of the first memory cell and wordline landing pads extending in the column direction, disposed on the other side of the power mesh cell, and electrically connected to the second wordline of the second memory cell, the second metal layer further includes an upper level first power line, disposed in the power mesh cell, electrically connected to the first and second power lines crossing the power mesh cell, the fourth metal layer further includes an upper level second power line disposed in the power mesh cell and extending in the row direction, and the third metal layer further includes landing pads electrically connected to the upper level first power line and the upper level second power line.

20. The semiconductor device of claim 19, wherein, in the one column:

the first pass-gate transistors and the first pull-down transistors of the first and second memory cells are formed in a first active region crossing the power mesh cell, the second pass-gate transistors and the second pull-down transistors of the first and second memory cells formed in a second active region crossing the power mesh cell, the third pass-gate transistors and the third pull-down transistors of the first and second memory cells are formed in a third active region crossing the power mesh cell, the fourth pass-gate transistors and the fourth pull-down transistors of the first and second memory cells are formed in a fourth active region crossing the power mesh cell, the first pull-up transistors of the first and second memory cells are formed in a fifth active region crossing the power mesh cell, and the second pull-up transistors of the first and second memory cells are formed in a sixth active region crossing the power mesh cell.

\* \* \* \* \*